(12) United States Patent
Lee et al.

(10) Patent No.: US 9,058,984 B2
(45) Date of Patent: Jun. 16, 2015

(54) METHOD FOR FABRICATING SEMICONDUCTOR DEVICE

(71) Applicant: SK hynix Inc., Gyeonggi-do (KR)

(72) Inventors: Kee-Jeung Lee, Gyeonggi-do (KR);
Kwon Hong, Gyeonngi-do (KR);
Kyung-Woong Park, Gyeonggi-do (KR); Ji-Hoon Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/268,576

(22) Filed: May 2, 2014

(65) Prior Publication Data

US 2014/0242772 A1    Aug. 28, 2014

Related U.S. Application Data

(62) Division of application No. 13/230,973, filed on Sep. 13, 2011, now Pat. No. 8,716,842.

(30) Foreign Application Priority Data

Dec. 10, 2010 (KR) .................. 10-2010-0126247

(51) Int. Cl.
*H01L 29/72* (2006.01)
*H01L 21/02* (2006.01)
*C23C 16/04* (2006.01)
*C23C 16/455* (2006.01)
*C23C 16/56* (2006.01)
*H01L 49/02* (2006.01)
*H01L 27/108* (2006.01)

(52) U.S. Cl.
CPC ........ *H01L 21/02263* (2013.01); *C23C 16/045* (2013.01); *C23C 16/45529* (2013.01); *C23C 16/45531* (2013.01); *C23C 16/56* (2013.01); *H01L 21/02148* (2013.01); *H01L 21/02159* (2013.01); *H01L 21/02161* (2013.01); *H01L 21/02181* (2013.01); *H01L 21/02189* (2013.01); *H01L 21/02194* (2013.01); *H01L 21/022* (2013.01); *H01L 21/0228* (2013.01); *H01L 21/02332* (2013.01); *H01L 21/0234* (2013.01); *H01L 21/02356* (2013.01); *H01L 27/1085* (2013.01); *H01L 28/40* (2013.01)

(58) Field of Classification Search
CPC ....................................... H01L 28/10
USPC ................................... 438/381, 785
See application file for complete search history.

(56) References Cited

U.S. PATENT DOCUMENTS

| | | | |
|---|---|---|---|
| 2005/0160981 A9 * | 7/2005 | Vaartstra | 118/715 |
| 2008/0184543 A1 * | 8/2008 | Sako et al. | 29/25.02 |
| 2011/0298039 A1 * | 12/2011 | Matsuo et al. | 257/324 |

* cited by examiner

*Primary Examiner* — Edward Wojciechowicz
(74) *Attorney, Agent, or Firm* — IP & T Group LLP

(57) ABSTRACT

A semiconductor device includes a dielectric layer in which zirconium, hafnium, and a IV group element are mixed. A method for fabricating a capacitor includes forming a bottom electrode, forming the dielectric layer and forming a top electrode over the dielectric layer.

18 Claims, 5 Drawing Sheets

(M IS IV GROUP ELEMENT)

(M IS IV GROUP ELEMENT)

(M IS IV GROUP ELEMENT)

METHOD FOR FABRICATING SEMICONDUCTOR DEVICE

CROSS-REFERENCE TO RELATED APPLICATIONS

This application is a division of U.S patent application Ser. No. 13/230,973 filed on Sep. 13, 2011, which claims priority of Korean patent application No. 10-2010-0126247, filed on Dec. 10, 2010.The disclosure of each of the foregoing application is incorporated herein by reference in its entirety.

BACKGROUND

1. Field

Exemplary embodiments of the present invention relate to a semiconductor fabrication technology, and more particularly, to a method for forming a dielectric layer and a capacitor in a semiconductor device.

2. Description of the Related Art

As semiconductor memory devices become highly integrated, the area of a unit memory cell and an operating voltage thereof decreases. Here, despite the reduction in a memory cell area, capacitance of, for example, 20 fF/cell or more is still desired to substantially prevent the occurrence of a soft error and a decrease in a refresh time.

To obtain an appropriate capacitance, a dielectric layer such as $ZrO_2/Al_2O_3/ZrO_2$ is used. However, due to the integration, it is difficult to ensure 20 fF/cell using the dielectric layer such as $ZrO_2/Al_2O_3/ZrO_2$ unless an effective electrode area is increased by increasing the height of a capacitor to above 1.7 μm in below 40 nm-process DRAMs.

Here, it is desirable to obtain cell capacitance of 20 fF/cell or more for below 40 nm-process DRAMs.

SUMMARY

An embodiment of the present invention is directed to a method for fabricating a semiconductor device including a dielectric layer for obtaining adequate cell capacitance.

In accordance with an embodiment of the present invention, a semiconductor device includes: a dielectric layer in which zirconium, hafnium, and a IV group element are mixed.

In accordance with another embodiment of the present invention, a method for fabricating a semiconductor device includes: forming a dielectric layer in which zirconium, hafnium, and a IV group element are mixed.

In accordance with further another embodiment of the present invention, a method for fabricating a capacitor includes: forming a bottom electrode; forming a dielectric layer over the bottom electrode, wherein zirconium, hafnium, and a IV group element are mixed in the dielectric layer; and forming a top electrode over the dielectric layer.

DETAILED DESCRIPTION

Figure 1A:
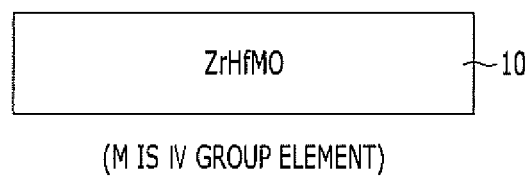
FIGS. 1A to 1C are cross-sectional views illustrating the structure of a dielectric layer according to an embodiment.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
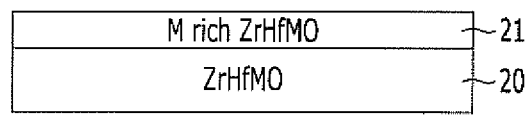
Figure 1C:
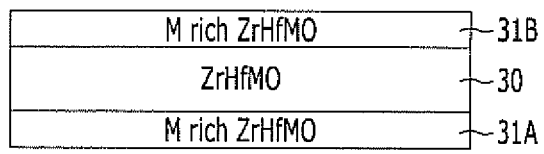

FIGS. 1A to 1C are cross-sectional views illustrating the structure of a dielectric layer in accordance with an embodiment of the present invention. For illustration purposes, a IV group element is referred to as 'M', and a dielectric layer including a mixture of zirconium (Zr), hafnium (Hf), and a IV group element is referred to as a 'ZrHfMO layer'.

Referring to FIG. 1A, a ZrHfMO layer 10 is formed. Since the M (that is, the IV group element) includes Si or Ce, the ZrHfMO layer 10 includes a ZrHfSiO layer or a ZrHfCeO layer.

In obtaining a tetragonal phase and a cubic phase, a hafnium oxide layer $HfO_2$ thermodynamically has a phase change temperature of 1720° C. and 2600° C. Meanwhile, if dopant is implanted, since dielectric tensor value is changed, a hexagonal phase or a cubic phase can be obtained near 600° C.±100° C. through phase change. For example, if dopant with an ion radius smaller than that of the hafnium is implanted, the hexahedral phase can be obtained. If dopant with an ion radius larger than that of the hafnium is implanted, the cubic phase can be obtained.

The ZrHfMO layer 10 is generated by mixing the hafnium oxide layer with a zirconium oxide layer $ZrO_2$ having physical/chemical properties similar to those of the hafnium oxide layer and relatively superior leakage current restraining force due to a large energy band (energy band/Eg) value, and simultaneously introducing the IV group element thereto, so that the hexagonal phase or the cubic phase is obtained near 600° C.±100° C. As a result, the ZrHfMO layer 10 has a dielectric constant of 50 to 60 and an equivalent oxide thickness (Tax) of about 5 Å.

As described above, the ZrHfMO layer 10 having the dielectric constant of 50 to 60 and the equivalent oxide thickness (Tax) of about 5 Å is formed, so that adequate cell capacitance is obtained more easily.

Referring to FIG. 1B, an M-rich ZrHfMO layer 21 having a relatively high composition ratio of the IV group element is stacked on a ZrHfMO layer 20. The total thickness of the dielectric layers 20 and 21 (that is, the ZrHfMO layer 20 and the M-rich ZrHfMO layer 21) may be equal to or less than at least 100 Å, and the M-rich ZrHfMO is layer 21 is formed with a thickness of 5 Å to 20 Å.

According to an example, the M-rich ZrHfMO layer 21 is stacked on the ZrHfMO layer 20. However, the M-rich ZrHfMO layer 21 may be stacked under the ZrHfMO layer 20.

Specifically, since the M-rich ZrHfMO layer 21 having the relatively high composition ratio of the IV group element is formed to make contact with an electrode, the leakage current restraining force may increase.

Referring to FIG. 1C, M-rich ZrHfMO layers 31A and 31B having a relatively high composition ratio of the IV group element are stacked on and under a ZrHfMO layer 30, respectively, so that a triple structure is obtained. The total thickness of the dielectric layers 30, 31A, and 31B (that is, the ZrHfMO layer 30 and the M-rich ZrHfMO layers 31A and 31B) may be equal to or less than 100 Å, and the M-rich ZrHfMO layers 31A and 31B are formed with a thickness of 5 Å to 20 Å, respectively.

As described above, the ZrHfMO layer including a mixture of the zirconium, the hafnium and the IV group element has a nano-lamination or nano-mixed structure. More specifically, the ZrHfMO layer has a structure in which a very thin zirconium layer, a hafnium layer, and a IV group element layer are repeatedly stacked, wherein the zirconium layer, the hafnium layer, and the IV group element layer are each formed not to exceed the maximum mixable deposition thickness. As a result, the ZrHfMO layer is provided in the form of a compound.

By using the ZrHfMO layer in the form of a compound, an equivalent oxide thickness (Tox) of 5 Å±0.5 Å with a dielectric constant of 50 to 60 may be obtained. More specifically, the M-rich ZrHfMO layer having a relatively large IV group element is formed to make contact with an electrode and a significant leakage current restraining force is obtained.

In order to form the ZrHfMO layer in the form of a compound, an atomic layer deposition (ALD) method can be used, which will be described in detail with reference to FIGS. 2A and 2B.

Figure 2A:
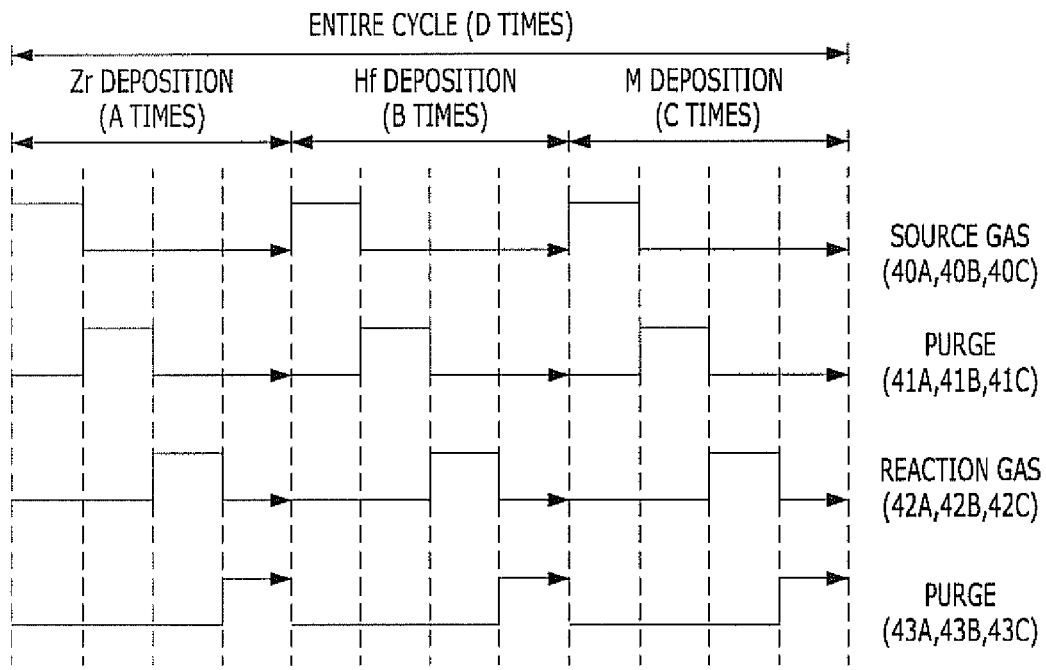
FIGS. 2A and 2B are timing diagrams illustrating an atomic layer deposition method for forming a dielectric layer according to an embodiment.
Figure 2B:
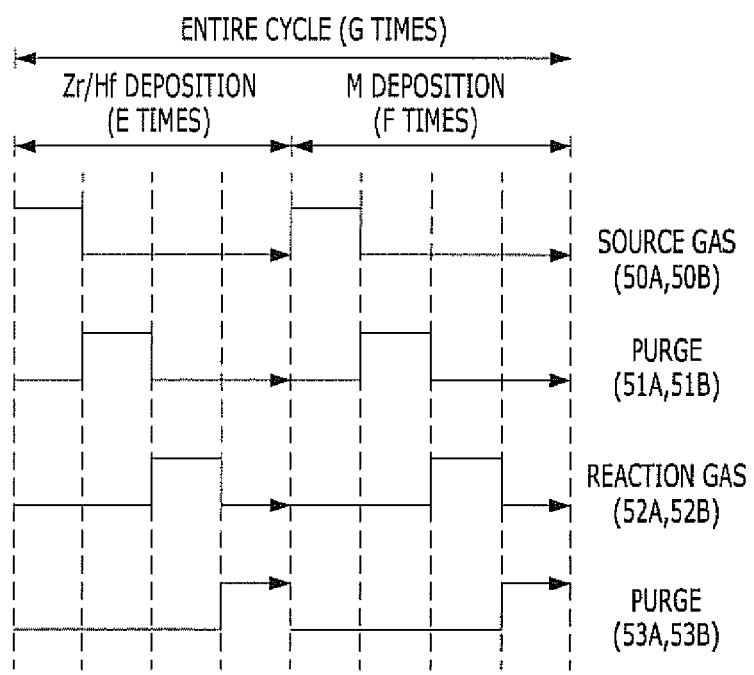

FIGS. 2A and 2B are timing diagrams illustrating the ALD method for forming a dielectric layer according to the embodiment. In the present embodiment, a nano-mix ALD method is used. For the nano-mix ALD method, processes substantially the same as those of the ALD method are performed, where respective layers are repeatedly stacked with a very thin thickness and the respective layers are formed not to exceed the maximum mixable deposition thickness, so that a stack structure is provided in the form of a compound.

As well known in the art, according to the ALD method, source gas is supplied, a source layer is created through chemically absorption on the surface of a substrate, and remaining gas is purged using purge gas. A thin film is deposited when a reaction gas is introduced and reacts with the source layer to deposit a desired atomic layer thin film, and remaining reaction gas is purged using the purge gas. The foregoing steps constitute a unit cycle. The ALD method as described above uses a surface reaction mechanism, where a uniform, stable thin film is obtained. Here, the ALD method may be applied to a structure having a large step difference and smaller design rules.

Furthermore, since the source gas and the reaction gas are sequentially introduced and purged while separating them from each other, the occurrence of particles due to a gas phase reaction may be reduced.

Referring to FIG. 2A, an ALD method for forming the ZrHfMO layer may include a unit cycle for depositing a zirconium oxide layer $ZrO_2$, a unit cycle for depositing a hafnium oxide layer $HfO_2$, and a unit cycle for depositing a IV group element oxide layer $MO_2$. Each unit cycle includes four steps of source gas/purge/reaction gas/purge.

More specifically, the unit cycle for depositing the zirconium oxide layer is performed in the sequence of a step 40A of introducing zirconium source gas, a step 41A of introducing purge gas, a step 42A of introducing reaction gas (for example, $O_3$), and a step 43A of introducing purge gas. The unit cycle for depositing the zirconium oxide layer is repeated A times to form the zirconium oxide layer with a desired thickness, wherein the number A is adjusted not to exceed the maximum deposition thickness by which the zirconium oxide layer is mixable.

The unit cycle for depositing the hafnium oxide layer is performed in the sequence of a step 40B of introducing hafnium source gas, a step 41B of introducing purge gas, a step 42B of introducing reaction gas (for example, $O_3$), and a step 43B of introducing purge gas. The unit cycle for depositing the hafnium oxide layer is repeated B times to form the hafnium oxide layer with a desired thickness, wherein the number B is adjusted not to exceed the maximum deposition thickness of the hafnium oxide layer where the hafnium oxide layer remains mixable.

The unit cycle for depositing the IV group element oxide layer is performed in the sequence of a step 40C of introducing IV group element source gas, a step 41C of introducing purge gas, a step 42C of introducing reaction gas (for example, $O_3$), and a step 43C of introducing purge gas. The unit cycle for depositing the IV group element oxide layer is repeated C times to form the IV group element oxide layer with a desired thickness, wherein the number C is adjusted not to exceed the maximum deposition thickness where the IV group element oxide layer remains mixable.

The number of repetitions of each unit cycle may be changed according to the type of a material, equipment and operating conditions, and a deposition speed or a growth speed may be changed according to the chemical composition of source gas or a precursor. A layer formed in each unit cycle may not exceed the respective maximum mixable deposition thickness.

Here, the unit cycle for the zirconium oxide layer is repeated A times, the unit cycle for the hafnium oxide layer is repeated B times, the unit cycle for the IV group element oxide layer is repeated C times, and the entire cycle (all of the foregoing unit cycles) is repeated D times by the number of desired stacks, so that the ZrHfMO layer having a mixed structure is finally formed. Here, the A, B, C and D are natural numbers, each number of repetitions may be adjusted such that the total thickness of dielectric layers does not exceed 100 Å and the content of the IV group element in the layer does not exceed 15% according to an example.

Referring to FIG. 2B, an ALD method for forming the ZrHfMO layer may include a unit cycle for depositing a zirconium hafnium oxide layer ZrHfO and a unit cycle for depositing a IV group element oxide layer $MO_2$. Each unit cycle includes the following four subsequent steps: source gas/purge/reaction gas/purge.

According to an example, the unit cycle for depositing the zirconium hafnium oxide layer is performed in the following sequence: a step 50A of introducing mixed source gas of zirconium and hafnium, and a step 51A of introducing purge gas, a step 52A of introducing reaction gas (for example, $O_3$), and a step 53A of introducing purge gas. The unit cycle for depositing the zirconium hafnium oxide layer is repeated E times to form the zirconium hafnium oxide layer with a desired thickness, wherein the E is adjusted not to exceed the maximum deposition thickness where the zirconium hafnium oxide layer remains mixable.

The unit cycle for depositing the IV group element oxide layer is performed in the following sequence: a step 50B of introducing IV group element source gas, a step 51B of introducing purge gas, a step 52B of introducing reaction gas (for example, $O_3$), and a step 53B of introducing purge gas. The unit cycle for depositing the IV group element oxide layer is repeated F times to form the IV group element oxide layer with a desired thickness, wherein the F is adjusted not to exceed the maximum deposition thickness where the IV group element oxide layer remains mixable.

The number of repetitions of each unit cycle may be changed according to the type of a material, equipment and operating conditions, and a deposition speed or a growth speed may be changed according to the chemical composition of source gas or a precursor. A layer formed in each unit cycle may not exceed the maximum mixable deposition thickness.

Furthermore, the unit cycle for the zirconium hafnium oxide layer is repeated E times, the unit cycle for the IV group element oxide layer is repeated F times, and the entire cycle is repeated G times to obtained the desired number of stacks, so that the ZrHfMO layer having a mixed structure is finally formed. Here, the E, F and G are natural numbers, each number of repetitions may be adjusted such that the total thickness of dielectric layers does not exceed 100 Å and the content of the IV group element in the layer does not exceed 15%, according to an example.

As described above, the ZrHfMO layer may be formed using the ALD method illustrated in FIGS. 2A and 2B, and the unit cycle for the IV group element oxide layer may be adjusted to form the M-rich ZrHfMO layer illustrated in FIGS. 1B and 1C. While the M-rich ZrHfMO layer includes the IV group element with a relatively large content, the number of repetitions of the cycle is adjusted such that the M-rich ZrHfMO layer has a thickness of 5 Å to 20 Å.

FIGS. 3A to 3F are cross-sectional views illustrating a method for fabricating a capacitor according to the embodiment. In the embodiment, the capacitor may form any one of a flat plate, a concave structure, a cylinder, and a pillar. Here, a concave-type capacitor is illustrated as an example.

Figure 3A:
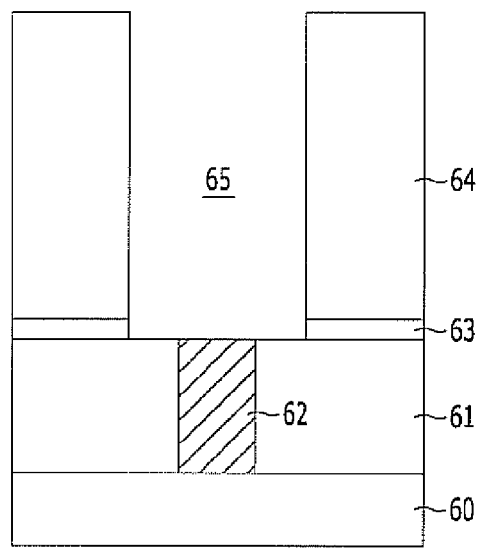
FIGS. 3A to 3F are cross-sectional views illustrating a method for fabricating a capacitor according to an embodiment.

Referring to FIG. 3A, an interlayer dielectric layer 61 is formed on a substrate 60. The substrate 60 is a semiconductor substrate for which a DRAM process is to be performed and may be a substrate for which desired processes for forming a gate pattern, a bit line pattern and the like have been completed.

The interlayer dielectric layer 61 serves as interlayer dielectric between the substrate 60 and a top capacitor and may include an oxide layer. The oxide layer may include one selected from the group consisting of a high density plasma (HDP) layer, a boron phosphorus silicate glass (BPSG) layer, a phosphorus silicate glass (PSG) layer, a boron silicate glass (BSG) layer, a tetra ethyle ortho silicate (TEOS) layer, a un-doped silicate glass (USG) layer, a fluorinated silicate glass (FSG) layer, a carbon doped oxide (CDO) layer, and an organo silicate glass (OSG) layer, or a stack layer of at least two layers thereof. Also, the oxide layer may include a layer coated using a spin coating method, such as a spin-on dielectric (SOD) layer.

A storage node contact plug 62 connected to the substrate 60 through the interlayer dielectric layer 61 is formed. The storage node contact plug 62 may be formed by etching the interlayer dielectric layer 61 to form a contact hole for exposing the substrate 60, filling a conductive material in the contact hole, and performing a planarization process until the surface of the interlayer dielectric layer 61 is exposed.

The conductive material may include one selected from the group consisting of a transition metal layer, a rare earth metal layer, an alloy layer thereof, or a silicide layer thereof, or may include an impurity-doped polysilicon layer. Also, a stack structure in which at least two layers of the conductive materials are stacked may be used. When the storage node contact plug 62 includes a metal layer (a transition metal, a rare earth metal), a barrier metal layer (not illustrated) may be further formed between the storage node contact plug 62 and the contact hole. According to an example, polysilicon is used as the conductive material.

An etch stop layer 63 is formed on the interlayer dielectric layer 61. The etch stop layer 63 substantially prevents the interlayer dielectric layer 61 from being damaged when forming a contact hole for a subsequent bottom electrode and prevents a solution from penetrating into the interlayer dielectric layer 61 in a dip-out process for forming a cylinder-type capacitor. In this regard, while the etch stop layer 63 includes a material having etching selectivity relative to the interlayer dielectric layer 61 and a subsequent sacrificial layer, the etch stop layer 63 may include a nitride layer and the nitride layer may include a silicon nitride layer (SiN, $Si_3N_4$).

A sacrificial layer 64 is formed on the etch stop layer 63. The sacrificial layer 64 is for providing a contact hole for forming a bottom electrode, and may include an oxide layer of a single layer or a multilayer. The oxide layer may include one selected from the group consisting of a high density plasma (HDP) layer, a boron phosphorus silicate glass (BPSG) layer, a phosphorus silicate glass (PSG) layer, a boron silicate glass (BSG) layer, a tetra ethyle ortho silicate (TEOS) layer, a un-doped silicate glass (USG) layer, a fluorinated silicate glass (FSG) layer, a carbon doped oxide (CDO) layer, and an organo silicate glass (OSG) layer, or a stack layer of at least two layers thereof. Also, the oxide layer may include a layer coated using a spin coating method, such as a spin-on dielectric (SOD) layer.

The sacrificial layer 64 and the etch stop layer 63 are etched to form a storage node hole 65 that exposes the storage node contact plug 62. The storage node hole 65 defines a region where the bottom electrode is to be formed and may be formed by forming a mask pattern on the sacrificial layer 64 and etching the sacrificial layer 64 and the etch stop layer 63 using the mask pattern as an etch barrier. The mask pattern may be formed by coating a photoresist layer on the sacrificial layer 64 and patterning the photoresist layer through an exposure and development process such that a region where a storage node hole is to be formed is opened. In order to ensure an etch margin insufficient when using the photoresist layer, a hard mask layer may be additionally formed before forming the photoresist layer.

Figure 3B:
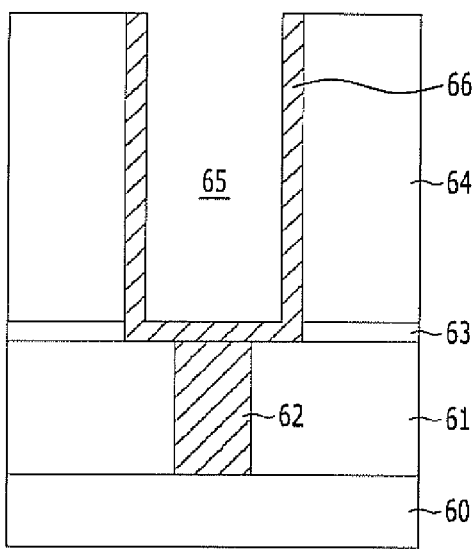

Referring to FIG. 3B, a bottom electrode 66 connected to the storage node contact plug 62 through the sidewall and the bottom portion of the storage node hole 65 is formed. The bottom electrode 66 includes a metal material layer such as one selected from the group consisting of a TiN layer, a TaN layer, a TiAlN layer, and a TaCN layer.

Although not illustrated in the drawing, a slightly plasma oxidation process may be performed on the surface of the bottom electrode 66 to form an interface layer thereon. The interface layer substantially prevents the occurrence of a leakage current by increasing a conduction barrier height between the bottom electrode 66 and a subsequent dielectric layer.

Figure 3C:
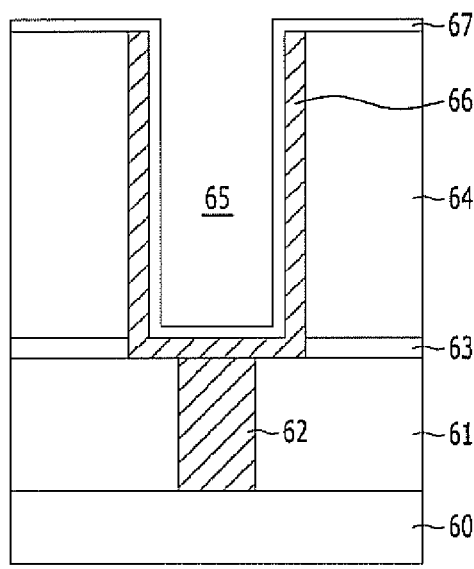

Referring to FIG. 3C, a dielectric layer 67 including a mixture of zirconium (Zr), hafnium (Hf), and IV group element is formed along a stepped portion of a resultant structure including the bottom electrode 66. The dielectric layer 67 may be formed using the ALD method, and is formed to have the structure illustrated in FIGS. 1A to 1C by performing the ALD method illustrated in FIGS. 2A and 2B.

The dielectric layer 67 has a nano-lamination or a nano-mixed structure of the zirconium, the hafnium, and the IV group element and is provided in the form of a compound. The dielectric layer 67 provided in the form of a compound has an equivalent oxide thickness (Tox) of 5 Å±0.5 Å with a dielectric constant of 50 to 60. More specifically, the M-rich ZrHfMO layer having a relatively large IV group element is formed to make contact with an electrode and cause an increase in the leakage current restraining force.

Figure 3D:
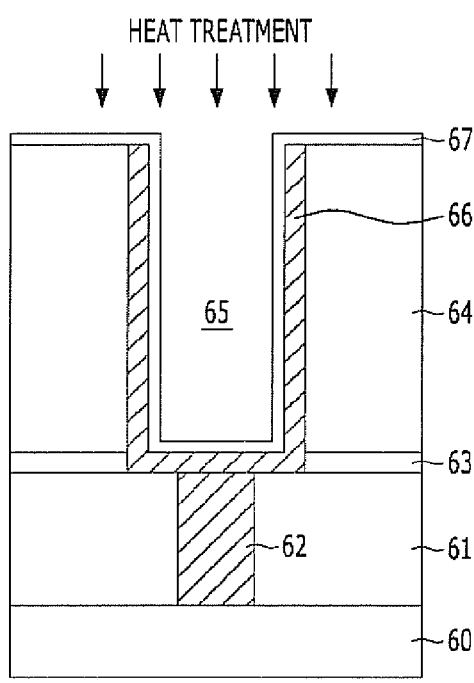

Referring to FIG. 3D, a thermal process is performed with respect to the dielectric layer 67. The thermal process may include a primary thermal process for crystallization and a secondary thermal process for impurity elimination. Also, the thermal process may include a primary thermal process for crystallization and a plasma oxidation process for impurity elimination.

The primary thermal process induces crystallization to improve a dielectric constant and is performed in a rapid thermal process ii) (RTP) or a furnace at the temperature of 500° C. to 700° C. under the $N_2$ atmosphere.

The secondary thermal process eliminates an impurity such as carbon or a hydrocarbon compound remaining in the dielectric layer 67 and eliminates oxygen vacancy and may be performed in the rapid thermal process (RTP) or the furnace at atmospheric pressure or reduced pressure under the $O_2$ or $O_3$ atmosphere.

Instead of the secondary thermal process, the plasma oxidation process may be performed at the relatively low temperature of 300° C. to 500° C. under the pressure of 0.1 Torr to 10 Torr.

Figure 3E:
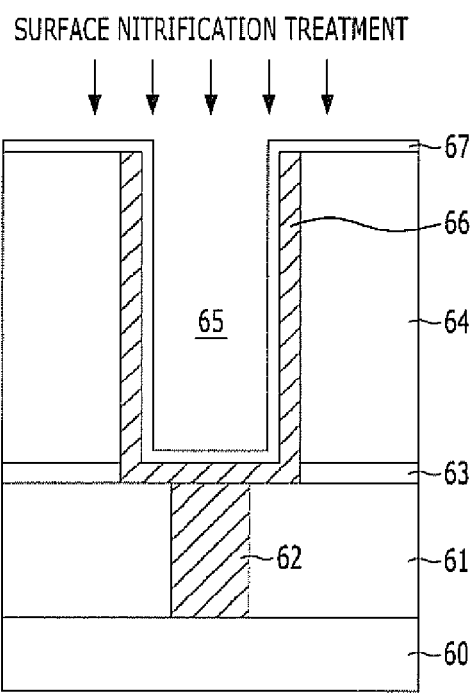

Referring to FIG. 3E, a plasma nitrification process is performed on the surface of the dielectric layer 67. The plasma nitrification process enhances threshold electric field characteristics and improves the thermal stabilization in a subsequent thermal process and is performed using remote $N_2$ plasma or $NH_3$ plasma at the temperature of 300° C. to 500° C. under the pressure of 0.1 Torr to 10 Torr.

Figure 3F:
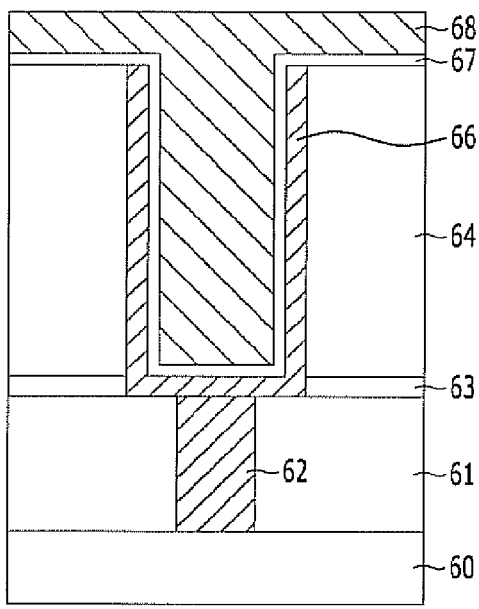

Referring to FIG. 3F, a top electrode 68 is formed on the dielectric layer 67. The top electrode 68 may include a material substantially the same as that of the bottom electrode 66. The top electrode 68, for example, may be formed by depositing a metal-based electrode selected from the group consisting of a TiN layer, a TaN layer, a TiAlN layer, and a TaCN layer.

Although not shown in the drawing, a capping layer or a buffer layer may be stacked on the top electrode 68 in order to substantially prevent the breakage of the dielectric layer 67 and the bottom electrode 66 due to a physical or chemical impact in a subsequent process, or a conductive layer may be stacked in order to improve electrical characteristics such as RC delay.

According to the method for fabricating the semiconductor device in accordance with the embodiment of the present invention, the ZrHfMO layer (M is a IV group element) including a mixture of zirconium, hafnium, and a IV group element is formed, where a structure having an equivalent oxide thickness (Tox) of 5 Å±0.5 Å with a dielectric constant of 50 to 60 is obtained. Here, an adequate cell capacitance may be obtained more easily.

Furthermore, the M-rich ZrHfMO layer including a IV group element with a relatively large content is formed at a portion making contact with the bottom electrode or the top electrode, where an increase in leakage current restraining force is obtained.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
forming a dielectric layer in which zirconium, hafnium, and a IV group element are mixed,
wherein the dielectric layer includes a ZrHfCeO layer and has a dielectric constant of 50 to 60.

2. The method of claim 1, wherein the dielectric layer is formed using an atomic layer deposition method.

3. The method of claim 2, wherein, in performing the atomic layer deposition method, a zirconium deposition cycle is performed A times, a hafnium deposition cycle is performed B times, a IV group element deposition cycle is performed C times, and the foregoing deposition cycles as a unit is performed D times, wherein A, B, C and D are natural numbers,
wherein the numbers A is adjusted not to exceed the maximum deposition thickness by which the zirconium remains mixable,
wherein the number B is adjusted not to exceed the maximum deposition thickness by which the hafnium remains mixable,
wherein the number C is adjusted not to exceed the maximum deposition thickness by which the IV group element remains mixable, and
wherein the number D is adjusted not to exceed a desired deposition total thickness of the dielectric layer.

4. The method of claim 2, wherein in performing the atomic layer deposition method, a zirconium/hafnium deposition cycle is performed E times, and a IV group element deposition cycle is performed F times, and the foregoing deposition cycles as a unit is performed G times, wherein E, F and G are natural numbers,
wherein the number E is adjusted not to exceed the maximum deposition thickness by which the zirconium/hafnium remains mixable,
wherein the number G is adjusted not to exceed the maximum deposition thickness by which the IV group element remains mixable, and
wherein the number G is adjusted not to exceed a desired deposition total thickness of the dielectric layer.

5. The method of claim 3, wherein each of the deposition cycles includes a source gas introduction step, a purge step, a reaction gas introduction step, and a purge step.

6. The method of claim 4, wherein the zirconium/hafnium deposition cycle includes a step of introducing a mixed source of zirconium and hafnium, a purge step, a reaction gas introduction step, and a purge step.

7. The method of claim 6, wherein, in the mixed source, a mixture ratio of the zirconium and the hafnium is adjusted to be 1:1 to 4.

8. A method for fabricating a capacitor, comprising:
forming a bottom electrode;
forming a dielectric layer over the bottom electrode, wherein zirconium, hafnium, and a IV group element are mixed in the dielectric layer; and
forming a top electrode over the dielectric layer,
wherein the dielectric layer has a stack structure of a ZrHfMO layer and an M-rich ZrHfMO layer, wherein M is a IV group element.

9. The method of claim 8, wherein the IV group element includes Si or Ce.

10. The method of claim 8, wherein the M-rich ZrHfMO layer is formed at a portion of the dielectric layer making contact with the bottom electrode.

11. The method of claim 8, wherein the dielectric layer further comprises an M-rich ZrHfMO layer is formed at a portion of the dielectric layer making contact with the top electrode.

12. The method of claim 8, further, before the forming of the top electrode, comprising:
   performing a thermal process on the dielectric layer; and
   performing a surface nitrification process.

13. The method of claim 12, wherein the thermal process includes a primary thermal process and a second thermal process or the primary thermal process and a plasma oxidation process.

14. The method of claim 13, wherein the primary thermal process is performed in a rapid thermal process or a furnace at a temperature of 500° C. to 700° C. under a nitrogen atmosphere.

15. The method of claim 13, wherein the secondary thermal process is performed in a rapid thermal process or a furnace under a $O_2$ or $O_3$ atmosphere.

16. The method of claim 13, wherein the plasma oxidation process is performed at a temperature of 300° C. to 500° C. under the pressure of 0.1 Torr to 10 Torr.

17. The method of claim 12, wherein the surface nitrification process is performed as a plasma nitrification process.

18. The method of claim 17, wherein the surface nitrification process is performed using $N_2$ plasma or $NH_3$ plasma at a temperature of 300° C. to 500° C. under the pressure of 0.1 Torr to 10 Ton.

* * * * *